(12) United States Patent
Campbell et al.

(10) Patent No.: US 12,189,064 B2
(45) Date of Patent: Jan. 7, 2025

(54) STACKED FILTER ASSEMBLY FOR OPTICAL INTEGRATED CIRCUIT PACKAGE WITH AN OPTICAL FILTER MOUNTED TO AN OPTICAL INTEGRATED CIRCUIT DEVICE BY A DISCRETE SEMICONDUCTOR SPACER BLOCK

(71) Applicant: STMicroelectronics International N.V., Geneva (CH)

(72) Inventors: Colin Campbell, Darvel (GB); Marco Antonelli, Edinburgh (GB); Calum Ritchie, Glasgow (GB); Bhagya Prakash Bandusena, Singapore (SG)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/133,299

(22) Filed: Apr. 11, 2023

(65) Prior Publication Data
US 2024/0345229 A1    Oct. 17, 2024

(51) Int. Cl.
*G01S 7/4865* (2020.01)
*G01S 17/10* (2020.01)
*H01L 31/0203* (2014.01)
*H01L 31/0216* (2014.01)
*H01L 31/173* (2006.01)

(52) U.S. Cl.
CPC ............ *G01S 7/4865* (2013.01); *G01S 17/10* (2013.01); *H01L 31/0203* (2013.01); *H01L 31/02162* (2013.01); *H01L 31/173* (2013.01)

(58) Field of Classification Search
CPC ... G01S 7/4865; G01S 17/10; H01L 31/0203; H01L 31/02162; H01L 31/173
See application file for complete search history.

(56) References Cited

U.S. PATENT DOCUMENTS

| 9,228,894 | B2 | 1/2016 | Sprafke | |
|---|---|---|---|---|
| 9,793,427 | B1 * | 10/2017 | Gani | G01V 8/10 |
| 2004/0135473 | A1 * | 7/2004 | Byers | H03H 9/54 |
| | | | | 310/348 |
| 2005/0110107 | A1 * | 5/2005 | Yamamoto | H01L 27/14636 |
| | | | | 257/433 |
| 2013/0175650 | A1 | 7/2013 | Gleason | |

(Continued)

FOREIGN PATENT DOCUMENTS

KR   1020220034437 A   3/2022

*Primary Examiner* — Thanh Luu
*Assistant Examiner* — Monica T Taba
(74) *Attorney, Agent, or Firm* — Crowe & Dunlevy LLC (57) ABSTRACT

A device includes an optical integrated circuit device mounted over an upper surface of a support substrate. The optical integrated circuit device includes an optical sensor array supported by a semiconductor substrate made of a first semiconductor material. A discrete semiconductor block, made of a second semiconductor material, is mounted over an upper surface of the optical integrated circuit device adjacent the optical sensor array. The first and second semiconductor materials have substantially matched coefficients of thermal expansion. A parallelpipedal-shaped optical filter is mounted over an upper surface of the discrete semiconductor block and extends over the optical sensor array. One or more edges/corners of the parallelpipedal-shaped optical filter cantilever over the optical sensor array without any provided support.

37 Claims, 4 Drawing Sheets

(56) References Cited

U.S. PATENT DOCUMENTS

2016/0245697 A1\* 8/2016 Shibayama ............... G01J 3/26
2017/0201230 A1\* 7/2017 Nomura .................. H01L 23/52
2020/0395396 A1\* 12/2020 Yoo .................. H01L 27/14625

\* cited by examiner

STACKED FILTER ASSEMBLY FOR OPTICAL INTEGRATED CIRCUIT PACKAGE WITH AN OPTICAL FILTER MOUNTED TO AN OPTICAL INTEGRATED CIRCUIT DEVICE BY A DISCRETE SEMICONDUCTOR SPACER BLOCK

TECHNICAL FIELD

The present invention generally relates to an optical integrated circuit package and, in particular, to the mounting of an optical filter to extend over an optical sensor of an optical integrated circuit device.

BACKGROUND

There is often a need in an optical integrated circuit package to mount an optical filter over the optical sensor of an optical integrated circuit device. As an example, a bead of adhesive material, perhaps containing a spacer material (such as beads of uniform size), is deposited on the upper surface of the optical integrated circuit device in a continuous ring shape around the optical sensor. The optical filter is then placed over the optical sensor in a spaced-apart relationship set by the dimension of the spacer beads and secured to the optical integrated circuit device using the adhesive material of the spacer ring. Alternatively, a spacer layer made of an insulating material (such as FR4-type material) with an opening extending therethrough is attached to the upper surface of the optical integrated circuit device by an adhesive layer with the opening aligned to the optical sensor. The optical filter is then placed over the optical sensor in a spaced-apart relationship set by the thickness of the spacer layer and secured by an adhesive layer to the upper surface of the spacer layer.

SUMMARY

In an embodiment, a device comprises: a support substrate; an optical integrated circuit device mounted over an upper surface of the support substrate; wherein said optical integrated circuit device includes an optical sensor array supported by a semiconductor substrate made of a first semiconductor material; a first discrete semiconductor block made of a second semiconductor material; wherein the first and second semiconductor materials have substantially matched coefficients of thermal expansion; wherein the first discrete semiconductor block is mounted over an upper surface of the optical integrated circuit device adjacent the optical sensor array; and a parallelpipedal-shaped optical filter mounted over an upper surface of the first discrete semiconductor block and extending over the optical sensor array.

In an implementation, one or more edges or corners of the parallelpipedal-shaped optical filter lack any form of support.

In an implementation, the device includes just one discrete semiconductor block supporting the parallelpipedal-shaped optical filter.

In an implementation, the device includes just two discrete semiconductor blocks supporting the parallelpipedal-shaped optical filter.

In an implementation, one edge of the parallelpipedal-shaped optical filter is supported by the discrete semiconductor block, while another edge opposite said one edge is not supported at all.

In an implementation, one corner of the parallelpipedal-shaped optical filter is supported by the discrete semiconductor block, while another corner opposite said one corner is not supported at all.

In an implementation a center of the parallelpipedal-shaped optical filter between opposite edges is supported by the discrete semiconductor block, while neither of said opposite edges is supported at all.

The device further comprises a cap mounted over the upper surface of the support substrate. The cap includes walls delimiting a cavity within which the optical sensor array is located. A wall opening in said cap is aligned with the optical sensor array, and a diffractive optical element (such as lens) is mounted at the wall opening.

BRIEF DESCRIPTION OF THE DRAWINGS

For a better understanding of the embodiments, reference will now be made by way of example only to the accompanying figures in which.

DETAILED DESCRIPTION

Figure 1:
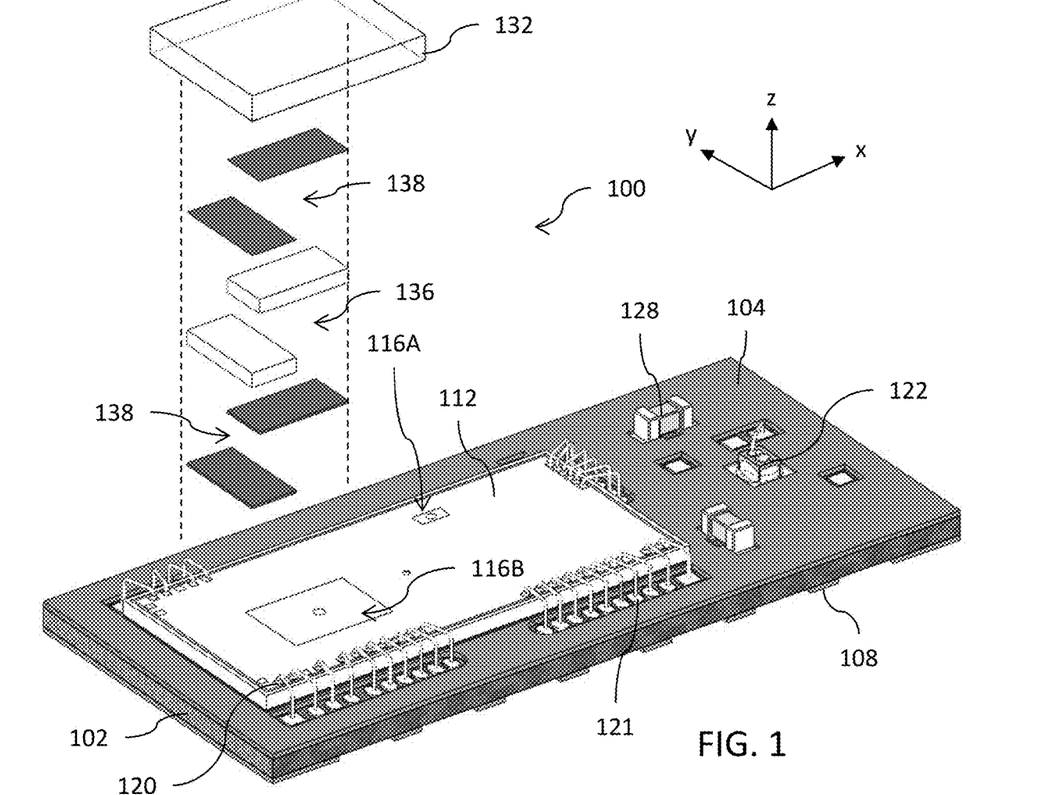
FIG. 1 illustrates an exploded perspective view of a portion of an optical integrated circuit package.
Figure 2:
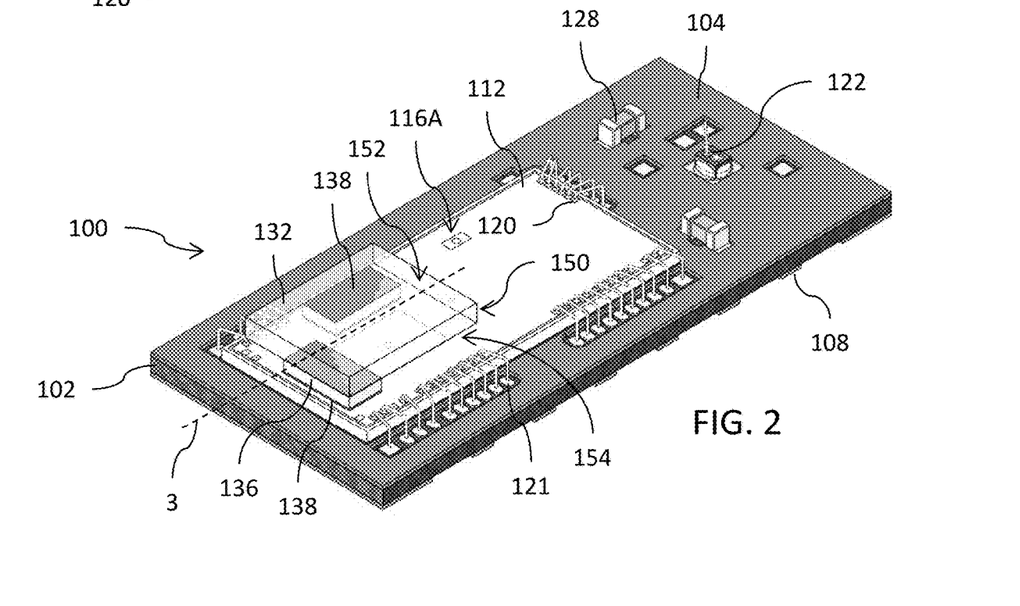
FIG. 2 illustrates an assembled perspective view of the portion of the optical integrated circuit package.
Figure 3:
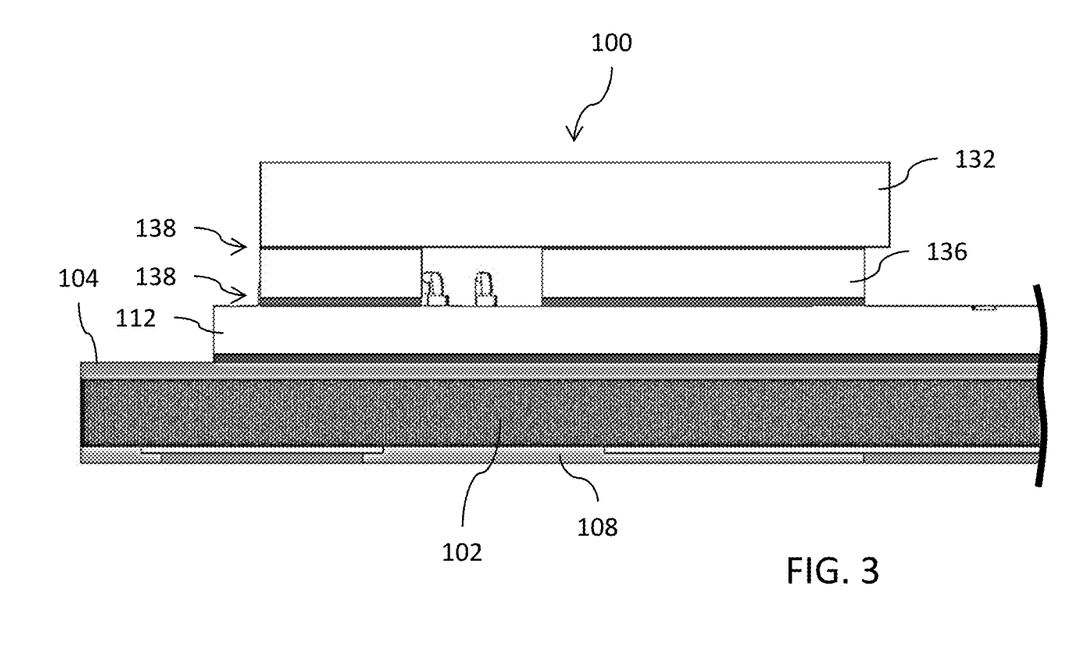
FIG. 3 illustrates a partial cross sectional view of the portion of the optical integrated circuit package.

Reference is made to FIGS. 1 and 2 illustrating an exploded perspective view and assembled perspective view, respectively, of a portion 100 of an optical integrated circuit package. Reference is also made to FIG. 3 which illustrates a partial cross sectional view of the portion 100 of the optical integrated circuit package taken along dotted line 3 in FIG. 2. A support substrate 102 is made of an insulating material (perhaps including multiple layers) and includes an upper surface and a lower surface. The support substrate 102 may, for example, be of a printed circuit board (PCB) type. The upper surface of support substrate 102 is covered by a first solder mask layer 104 including openings that expose upper circuit connection pads. The lower surface of support substrate 102 is covered by a second solder mask layer 108 including openings that expose lower circuit pads. The upper circuit connection pads are electrically connected to the lower circuit pads through an electrical interconnection network (not explicitly shown) within the support substrate 102.

A lower (or back) surface of an optical sensor integrated circuit (IC) device (i.e., an IC die) 112 is mounted to the upper surface of the first solder mask layer 104 and electrical pads 120 of the optical sensor integrated circuit device 112 are wirebonded to certain ones of the upper circuit connection pads 121 located within corresponding opening(s) in the first solder mask layer 104. The optical sensor integrated circuit device 112 includes, at its upper (or front) surface, a first optical sensor array 116A and a second optical sensor array 116B (i.e., a front-side illuminated sensor) supported by a semiconductor material substrate. The arrays 116A and 116B include one or more photosensitive circuits formed on and/or in the semiconductor material substrate such as, for example, single photon avalanche diodes (SPADs). Although wirebonding is shown by example, it will be understood that the optical sensor integrated circuit device 112 may instead be surface mounted, in a flip-chip configuration, to certain ones of the upper circuit connection pads located within an opening in the first solder mask layer 104, with the first optical sensor array 116A and second optical sensor array 116B provided at a lower (or back) surface (i.e., a back-side illuminated sensor).

An optical emitter integrated circuit device 122 is surface mounted to certain one(s) of the upper circuit connection pads within corresponding opening(s) in the first solder mask layer 104 and wirebonded to certain other one(s) of the upper circuit connection pads within corresponding opening(s) in the first solder mask layer 104.

Auxiliary circuit components 128 are surface mounted to certain ones of the upper circuit connection pads within corresponding openings in the first solder mask layer 104.

The illustrated circuitry may, for example, form a time-of-flight sensing circuit where the optical emitter integrated circuit device 122 is configured to emit a pulse of (infrared) light that is sensed by the first optical sensor array 116A of the optical sensor integrated circuit device 112 to provide a reference time for light emission, with a target reflection of the emitted pulse of light being sensed by the second optical sensor array 116B of the optical sensor integrated circuit device 112 to provide a detection time for light reflection. Distance from the optical integrated circuit package to the target may then be calculated as a function of the time difference between the reference time and the detection time. Power connections and signal connections for the portion 100 are provided through the lower circuit pads exposed by the openings in the second solder mask layer 108.

An optical filter 132 is mounted to extend over the second optical sensor array 116B of the optical sensor integrated circuit device 112. The optical filter 132 may, for example, be configured to selectively pass light within a certain range of wavelengths (for example, infrared) corresponding to a wavelength of the light emitted by the optical emitter integrated circuit device 122. The optical filter 132 is configured as a flat rectangular plate that has, for example, a parallelpipedal shape (i.e., a six-faced polyhedron all of whose faces are parallelograms lying in pairs of parallel planes). The major (i.e., top and bottom) faces of the parallelpipedal-shaped optical filter 132 extend in the x-y plane parallel to the upper surface of the optical sensor integrated circuit device 112 and completely cover the second optical sensor array 116B. The minor (i.e., side or peripheral edge) faces of the parallelpipedal-shaped optical filter 132 extend in the z-direction perpendicular to the upper surface of the optical sensor integrated circuit device 112.

The mounting of the optical filter 132 offset in the z-direction to the upper surface of the optical sensor integrated circuit device 112 is accomplished using one or two discrete spacer blocks 136 and adhesive layers 138. In the embodiment of the portion 100 of the optical integrated circuit package shown in FIGS. 1 and 2, a pair of spacer blocks 136 are provided with one spacer block arranged to longitudinally extend (for example, in the x-direction) parallel to a first side edge of the optical filter 132 and another spacer block arranged to longitudinally extend (for example, in the y-direction) parallel to a second side edge of the optical filter 132 (where the first and second side edges are adjacent each other). The spacer blocks 136, which have a thickness in the z-direction substantially equal to a desired z-direction offset of the optical filter 132 from the upper surface of the optical sensor integrated circuit device 112, are each made of a silicon material formed as a flat rectangular plate (having, for example, a parallelpipedal shape). The bottom surface of each spacer block is attached, for example using a layer of adhesive material (for example, comprising a die attach film (DAF) layer), to the upper surface of the optical sensor integrated circuit device 112. The bottom surface of the optical filter 132 is attached, for example using a layer of adhesive material (for example, comprising a die attach film (DAF) layer), to the upper surfaces of the spacer blocks 136.

The spacer blocks 136 may, for example, be manufactured by singulating (i.e., dicing) a wafer of semiconductor (for example, silicon) material having a desired thickness in the z direction into desired sizes in the x-y plane. In an implementation, the semiconductor material of the wafer used to make the spacer blocks and the semiconductor substrate material of the optical sensor integrated circuit device 112 are preferably a same semiconductor material (having identical coefficients of thermal expansion) or semiconductor materials have substantially similar coefficients of thermal expansion (for example, +/−5% of each other). The diced portions of the wafer forming the spacer blocks 136 are then positioned, for example using a suitable pick-and-place manufacturing operation, at desired locations on the upper surface of the optical sensor integrated circuit device 112. These desired locations may comprise, for example, free areas at the upper surface of the optical sensor integrated circuit device 112 where neither the first optical sensor array 116A, nor the second optical sensor array 116B, nor the electrical pads 120 of the optical sensor integrated circuit device 112 are located. In particular, the free areas where the spacer blocks 136 are positioned for attachment may comprise areas along a side edge of the second optical sensor array 116B and/or between the side edge of the second optical sensor array 116B and the electrical pads of the optical sensor integrated circuit device 112. The adhesive material layers 138 may, for example, be provided at upper and lower surfaces of the wafer of semiconductor prior to singulation.

Likewise, the optical filter 132 may, for example, be manufactured by singulating (i.e., dicing) a wafer of transparent (for example, glass) material having desired thickness in the z direction into desired sizes in the x-y plane. The diced portion of the wafer forming the optical filter 132 is then positioned, for example using a suitable pick-and-place manufacturing operation, at a desired location on the spacer block(s) 136 and extending over at least the second optical sensor array 116B.

Suitable ultra-violet (UV) exposure may be used to activate and cure the adhesive material of the layers 138 during manufacture of the portion 100.

It will be noted that at least one corner of the optical filter 132, and perhaps two or more distal portions of side edges of the optical filter 132, are not supported at all by a spacer block 136. That at least one corner and/or two or more distal portions of side edges of the optical filter 132 extend unsupported, in a cantilever-like fashion, over the second optical sensor array 116B of the optical sensor integrated circuit device 112. In the embodiment of the portion 100 of the optical integrated circuit package shown in FIGS. 1 and 2, the corner 150 and/or the distal portions 152, 154 of adjacent side edges (located, for example, at said corner 150) are unsupported by the spacer blocks 136.

Figure 5:
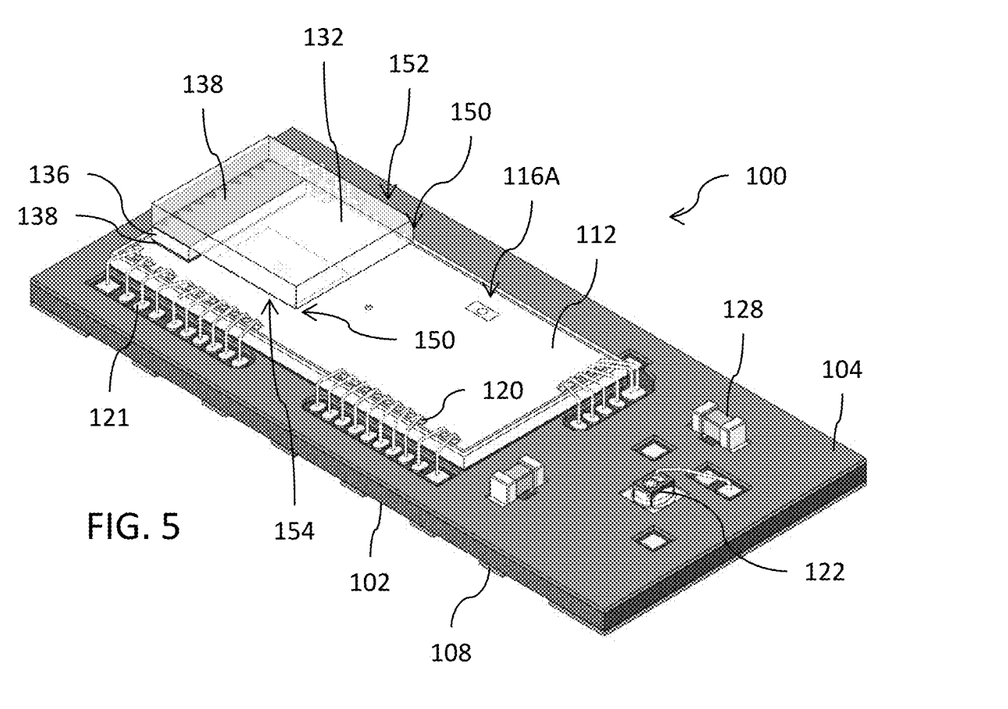
FIGS. 5 and 6 illustrate an assembled perspective views of implementations for the portion of the optical integrated circuit package utilizing only a single spacer to support the optical filter.

In particular: a first edge of the parallelpipedal-shaped optical filter 132 is supported by the discrete spacer block 136 and a second edge of the parallelpipedal-shaped optical filter 132 opposite the first edge is not supported at all (see, FIG. 5, for example). Alternatively: a first corner of the parallelpipedal-shaped optical filter 132 is supported by the discrete spacer block(s) 136 and a second corner of the parallelpipedal-shaped optical filter diagonally opposite the first corner is not supported at all by a spacer (see, FIG. 2, for example). In another implementation: the parallelpipedal-shaped optical filter 132 includes a first edge and a second edge opposite the first edge of the parallelpipedal-shaped optical filter, with the discrete spacer block 136 positioned between the first and second edges, and neither of the opposed first and second edges of the parallelpipedal-shaped optical filter 132 is supported at all by a spacer. In yet another implementation: the parallelpipedal-shaped optical filter 132 includes a first edge and a second edge adjacent the first edge, with one discrete spacer block 136 positioned adjacent the first edge of the parallelpipedal-shaped optical filter, and another discrete spacer block 136 positioned adjacent the second edge of the parallelpipedal-shaped optical filter (see, FIG. 2, for example). In this case, it will be noted that a corner of the parallelpipedal-shaped optical filter 132 diagonally opposite a corner at the adjacent first and second edges of the parallelpipedal-shaped optical filter 132 is not supported at all by a spacer.

Figure 4:
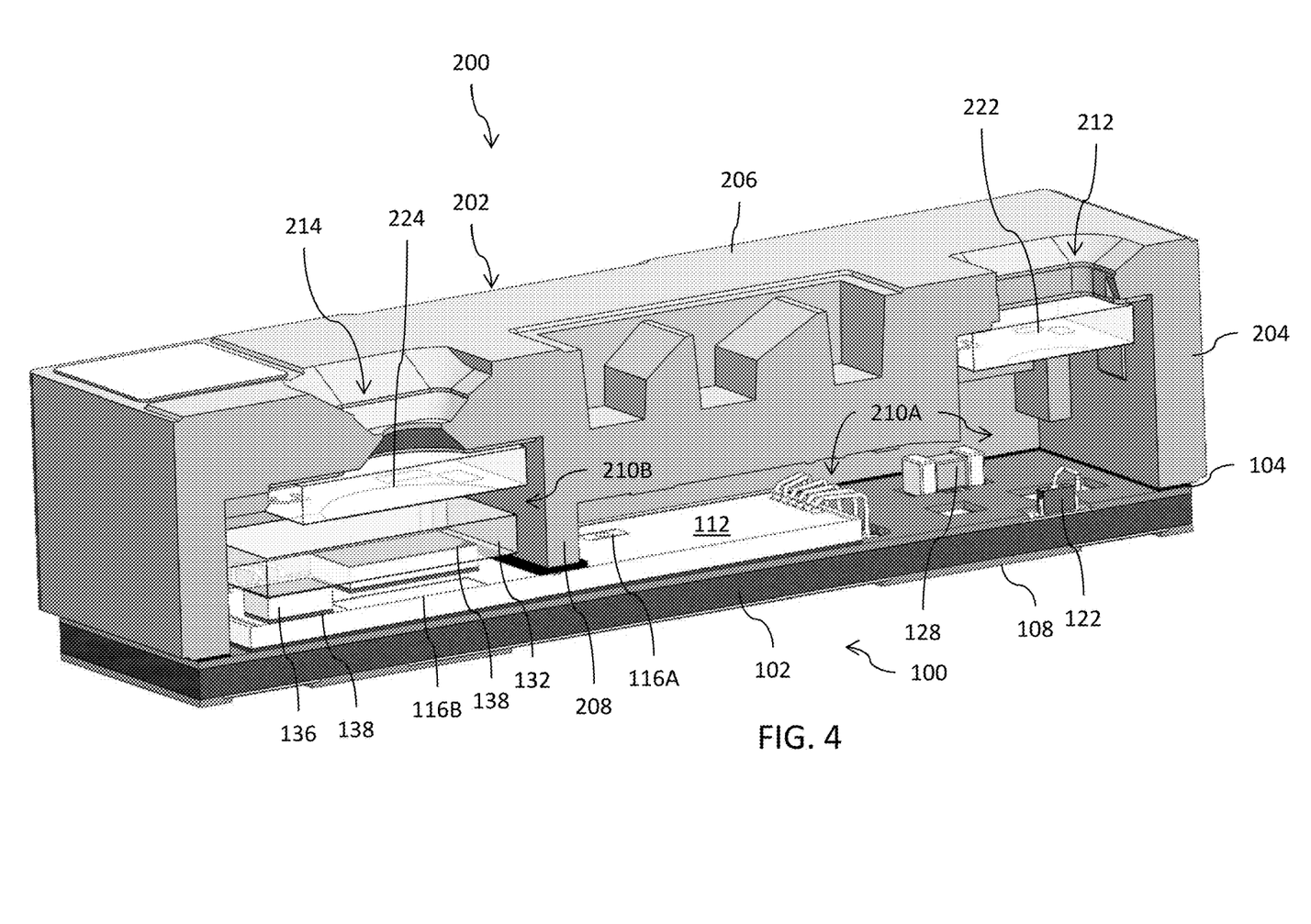
FIG. 4 illustrates a cross sectional perspective view of the optical integrated circuit package.

Reference is now made to FIG. 4 which illustrates a cross sectional perspective view of an optical integrated circuit package 200 including the portion 100 of FIGS. 1 and 2. A cap 202 is mounted to the upper surface of the first solder mask layer 104. The cap includes side walls 204, a front wall 206 over the side walls and a partition wall 208 extending between an opposed pair of side walls. The partition wall 208 is arranged to be placed between the first optical sensor array 116A and the second optical sensor array 116B of the optical sensor integrated circuit device 112. The side walls 204, front wall 206 and partition wall 208 delimit two cavities within the cap 202. The first cavity 210A includes the optical emitter integrated circuit device 122 and a portion of the optical sensor integrated circuit device 112 which includes the first optical sensor array 116A. The second cavity 210B includes a portion of the optical sensor integrated circuit device 112 which includes the second optical sensor array 116B. The partition wall 208 provides a light barrier for blocking light emitted by the optical emitter integrated circuit device 122 from directly reaching the second optical sensor array 116B (in other words, the emitted light is block from propagating within the confines of the cap 202 to reach the second optical sensor array 116B). It will be noted that light emitted by the optical emitter integrated circuit device 122 can still directly reach the first optical sensor array 116A by propagating within the first cavity of the cap 202. The front wall 206 includes a first opening 212 aligned with the optical emitter integrated circuit device 122 and a second opening 214 aligned with the second optical sensor array 116B. A first diffractive optical element 222 (for example, a lens) is mounted at and/or within the first opening 212. Light emitted by the optical emitter integrated circuit device 122 passes through the first opening 212 and is directed by the first diffractive optical element 222 to illuminate a scene. A second diffractive optical element 224 (for example, a lens) is mounted at and/or within the second opening 214. Light reflected by an object in the illuminated scene passes through the second opening 214, is collected by the second diffractive optical element 224 and passes through the optical filter 134 to reach the second optical sensor array 116B.

Figure 6:
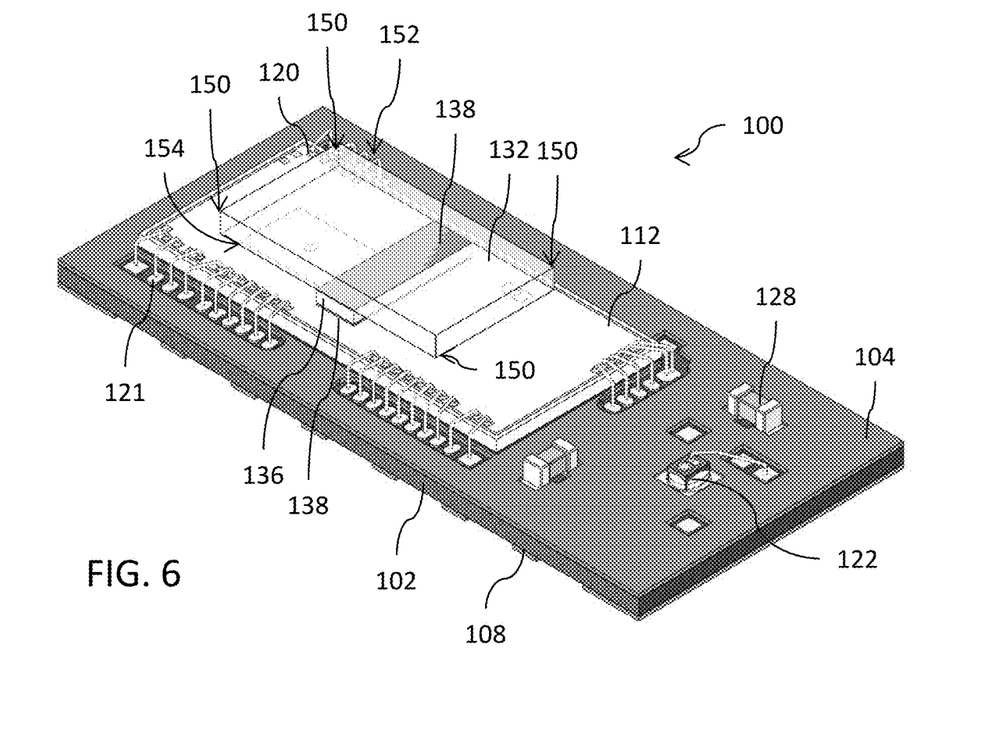

While FIGS. 1-4 show an implementation using a pair of spacer blocks 136 supporting adjacent sides of the optical filter 132, it will be noted that alternative implementations as shown in FIGS. 5 and 6 may instead utilize just a single spacer block 136. In the FIG. 5 implementation, the spacer block 136 is provided at one end of the optical filter along a side edge with the optical filter 132 extending in a cantilever over the second optical sensor array 116B. Note here that the side edge of the optical filter 132 opposite to that where the spacer block 136 is attached is freely suspended with the adjacent corners 150 and/or the distal portions 152, 154 of the side edges (located, for example, at each corner 150) unsupported by any spacer block 136. In the FIG. 6 implementation, the spacer block 136 is provided at a location between opposite ends of the optical filter extending between opposed side edges. Each of the opposite ends of the optical filter 132 extends in a cantilever from the supporting spacer block 136 with one end extending over the first optical sensor array 116A and another end extending over the second optical sensor array 116B. Note here that the opposite side edges of the optical filter 132 between which the spacer block 136 is attached are freely suspended with the adjacent corners 150 and/or the distal portions 152, 154 of the side edges (located, for example, at each corner 150) unsupported by any spacer block 136.

A number of advantages accrue from the use of the configuration for the portion 100 as described above in FIGS. 1-6, including: a) a reduction in cost of the assembly comprising the portion 100; b) support for an optical sensor integrated circuit device 112 having a smaller dimension (since the spacer block(s) 136 can be selectively attached at open/free surface areas on the upper surface of the die); c) support for a second optical sensor array 116B of the optical sensor integrated circuit device 112 having a larger dimension (since the spacer block(s) 136 can be selectively attached at open/free surface areas on the upper surface of the die offset from the arrays 116A and 116B); d) support for the portion 100, and hence the overall package 200, having a smaller dimension (since the spacer structure supporting the optical filter 132 need not completely surround the second optical sensor array 116B of the optical sensor integrated circuit device 112); and e) reduction in thermal stress applied to the optical sensor integrated circuit device 112 (since coefficients of thermal expansion for the semiconductor material of the spacer block(s) 136 and the semiconductor substrate material of the optical sensor integrated circuit device 112 can be identical or substantially matched).

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A device, comprising:
   a support substrate;
   an optical integrated circuit device mounted over an upper surface of the support substrate;
   wherein said optical integrated circuit device includes an optical sensor array supported by a semiconductor substrate made of a first semiconductor material;
   a first discrete semiconductor block made of a second semiconductor material;
   wherein the first and second semiconductor materials have substantially matched coefficients of thermal expansion;

wherein the first discrete semiconductor block is mounted over an upper surface of the optical integrated circuit device adjacent the optical sensor array; and a parallelpipedal-shaped optical filter mounted over an upper surface of the first discrete semiconductor block and extending over the optical sensor array;

wherein a first edge of the parallelpipedal-shaped optical filter is supported by the first discrete semiconductor block and a second edge of the parallelpipedal-shaped optical filter opposite the first edge is not supported at all.

2. The device of claim 1, wherein the first and second semiconductor materials are a same semiconductor material.

3. The device of claim 2, wherein said same semiconductor material is silicon.

4. The device of claim 1, wherein the parallelpipedal-shaped optical filter is supported solely by said first discrete semiconductor block.

5. The device of claim 1, further comprising:
a first adhesive layer between the first discrete semiconductor block and the upper surface of the optical integrated circuit device; and
a second adhesive layer between the parallelpipedal-shaped optical filter and the upper surface of the first discrete semiconductor block.

6. The device of claim 5, wherein at least one of the first and second adhesive layers is formed by a die attach film (DAF) layer.

7. The device of claim 1, further comprising a cap mounted over the upper surface of the support substrate, said cap including walls delimiting a cavity within which the optical sensor array and at least part of said optical integrated circuit device is located, said cap including a wall opening aligned with the optical sensor array.

8. The device of claim 7, further comprising a diffractive optical element mounted at said wall opening.

9. The device of claim 1, wherein said support substrate comprises a printed circuit board (PCB) including circuit connection pads that are electrically connected to electrical connection pads of the optical integrated circuit device.

10. A device, comprising:
a support substrate;
an optical integrated circuit device mounted over an upper surface of the support substrate;
wherein said optical integrated circuit device includes an optical sensor array supported by a semiconductor substrate made of a first semiconductor material;
a first discrete semiconductor block made of a second semiconductor material;
wherein the first and second semiconductor materials have substantially matched coefficients of thermal expansion;
wherein the first discrete semiconductor block is mounted over an upper surface of the optical integrated circuit device adjacent the optical sensor array; and
a parallelpipedal-shaped optical filter mounted over an upper surface of the first discrete semiconductor block and extending over the optical sensor array;
wherein a first corner of the parallelpipedal-shaped optical filter is supported by the first discrete semiconductor block and a second corner of the parallelpipedal-shaped optical filter opposite the first corner is not supported at all.

11. The device of claim 10, wherein the first and second semiconductor materials are a same semiconductor material.

12. The device of claim 11, wherein said same semiconductor material is silicon.

13. The device of claim 10, wherein the parallelpipedal-shaped optical filter is supported solely by said first discrete semiconductor block.

14. The device of claim 10, further comprising:
a first adhesive layer between the first discrete semiconductor block and the upper surface of the optical integrated circuit device; and
a second adhesive layer between the parallelpipedal-shaped optical filter and the upper surface of the first discrete semiconductor block.

15. The device of claim 14, wherein at least one of the first and second adhesive layers is formed by a die attach film (DAF) layer.

16. The device of claim 10, further comprising a cap mounted over the upper surface of the support substrate, said cap including walls delimiting a cavity within which the optical sensor array and at least part of said optical integrated circuit device is located, said cap including a wall opening aligned with the optical sensor array.

17. The device of claim 16, further comprising a diffractive optical element mounted at said wall opening.

18. The device of claim 10, wherein said support substrate comprises a printed circuit board (PCB) including circuit connection pads that are electrically connected to electrical connection pads of the optical integrated circuit device.

19. A device, comprising:
a support substrate;
an optical integrated circuit device mounted over an upper surface of the support substrate;
wherein said optical integrated circuit device includes an optical sensor array supported by a semiconductor substrate made of a first semiconductor material;
a first discrete semiconductor block made of a second semiconductor material;
wherein the first and second semiconductor materials have substantially matched coefficients of thermal expansion;
wherein the first discrete semiconductor block is mounted over an upper surface of the optical integrated circuit device adjacent the optical sensor array; and
a parallelpipedal-shaped optical filter mounted over an upper surface of the first discrete semiconductor block and extending over the optical sensor array;
wherein the parallelpipedal-shaped optical filter includes a first edge and a second edge opposite the first edge of the parallelpipedal-shaped optical filter, and wherein the first discrete semiconductor block is positioned between the first and second edges, and wherein neither of the first and second edges of the parallelpipedal-shaped optical filter is supported at all.

20. The device of claim 19, wherein said optical integrated circuit device further includes a further optical sensor array, and wherein said first discrete semiconductor block is positioned between the optical sensor array and the further optical sensor array.

21. The device of claim 20, wherein the parallelpipedal-shaped optical filter at said first edge extends over the optical sensor array, and wherein the parallelpipedal-shaped optical filter at said second edge extends over the further optical sensor array.

22. The device of claim 19, wherein the first and second semiconductor materials are a same semiconductor material.

23. The device of claim 22, wherein said same semiconductor material is silicon.

24. The device of claim 19, wherein the parallelpipedal-shaped optical filter is supported solely by said first discrete semiconductor block.

25. The device of claim 19, further comprising:
a first adhesive layer between the first discrete semiconductor block and the upper surface of the optical integrated circuit device; and
a second adhesive layer between the parallelpipedal-shaped optical filter and the upper surface of the first discrete semiconductor block.

26. The device of claim 25, wherein at least one of the first and second adhesive layers is formed by a die attach film (DAF) layer.

27. The device of claim 19, further comprising a cap mounted over the upper surface of the support substrate, said cap including walls delimiting a cavity within which the optical sensor array and at least part of said optical integrated circuit device is located, said cap including a wall opening aligned with the optical sensor array.

28. The device of claim 27, further comprising a diffractive optical element mounted at said wall opening.

29. The device of claim 19, wherein said support substrate comprises a printed circuit board (PCB) including circuit connection pads that are electrically connected to electrical connection pads of the optical integrated circuit device.

30. A device, comprising:
a support substrate;
an optical integrated circuit device mounted over an upper surface of the support substrate;
wherein said optical integrated circuit device includes an optical sensor array supported by a semiconductor substrate made of a first semiconductor material;
a first discrete semiconductor block made of a second semiconductor material;
wherein the first and second semiconductor materials have substantially matched coefficients of thermal expansion;
wherein the first discrete semiconductor block is mounted over an upper surface of the optical integrated circuit device adjacent the optical sensor array; and
a parallelpipedal-shaped optical filter mounted over an upper surface of the first discrete semiconductor block and extending over the optical sensor array;
wherein the parallelpipedal-shaped optical filter is supported solely by said first discrete semiconductor block; and
wherein a first edge of the parallelpipedal-shaped optical filter is supported by the first discrete semiconductor block and a second edge of the parallelpipedal-shaped optical filter opposite the first edge is not supported at all.

31. The device of claim 30, wherein the first and second semiconductor materials are a same semiconductor material.

32. The device of claim 31, wherein said same semiconductor material is silicon.

33. The device of claim 30, further comprising:
a first adhesive layer between the first discrete semiconductor block and the upper surface of the optical integrated circuit device; and
a second adhesive layer between the parallelpipedal-shaped optical filter and the upper surface of the first discrete semiconductor block.

34. The device of claim 33, wherein at least one of the first and second adhesive layers is formed by a die attach film (DAF) layer.

35. The device of claim 30, further comprising a cap mounted over the upper surface of the support substrate, said cap including walls delimiting a cavity within which the optical sensor array and at least part of said optical integrated circuit device is located, said cap including a wall opening aligned with the optical sensor array.

36. The device of claim 35, further comprising a diffractive optical element mounted at said wall opening.

37. The device of claim 30, wherein said support substrate comprises a printed circuit board (PCB) including circuit connection pads that are electrically connected to electrical connection pads of the optical integrated circuit device.

* * * * *